(12) United States Patent
Kim et al.

(10) Patent No.: US 11,482,285 B2
(45) Date of Patent: Oct. 25, 2022

(54) INTEGRATED CIRCUIT DEVICES AND METHODS OF MANUFACTURING SAME

(71) Applicant: Samsung Electronics Co., Ltd., Suwon-si (KR)

(72) Inventors: Sung-woo Kim, Hwaseong-si (KR); Jae-Kyu Lee, Seoul (KR); Ki-seok Suh, Hwaseong-si (KR); Hyeong-sun Hong, Seongnam-si (KR); Yoo-sang Hwang, Suwon-si (KR); Gwan-hyeob Koh, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 173 days.

(21) Appl. No.: 16/936,917

(22) Filed: Jul. 23, 2020

(65) Prior Publication Data

US 2020/0357466 A1 Nov. 12, 2020

Related U.S. Application Data

(62) Division of application No. 16/533,143, filed on Aug. 6, 2019, now Pat. No. 10,777,276, which is a division
(Continued)

(30) Foreign Application Priority Data

Dec. 1, 2016 (KR) .................. 10-2016-0162915

(51) Int. Cl.
 *H01L 23/528* (2006.01)
 *H01L 43/12* (2006.01)
(Continued)

(52) U.S. Cl.
 CPC ............ *G11C 14/0036* (2013.01); *G11C 7/10* (2013.01); *G11C 11/005* (2013.01);
(Continued)

(58) Field of Classification Search
 CPC .............. G11C 14/0045; H01L 23/528; H01L 27/0207; H01L 29/0847; H01L 29/4236;
(Continued)

(56) References Cited

U.S. PATENT DOCUMENTS 5,880,991 A 3/1999 Hsu et al.
6,259,126 B1 7/2001 Hsu et al.
(Continued)

FOREIGN PATENT DOCUMENTS

KR 101615276 B1 4/2016
KR 20160101901 A 8/2016

*Primary Examiner* — Shih Tsun A Chou
(74) *Attorney, Agent, or Firm* — Harness, Dickey & Pierce, P.L.C.

(57) ABSTRACT

An integrated circuit (IC) device may include a single substrate that includes a single chip, and a plurality of memory cells spaced apart from one another on the substrate and having different structures. Manufacturing the IC device may include forming a plurality of first word lines in a first region of the substrate, and forming a plurality of second word lines in or on a second region of the substrate. Capacitors may be formed on the first word lines. Source lines may be formed on the second word lines. An insulation layer that covers the plurality of capacitors and the plurality of source lines may be formed in the first region and the second region. A variable resistance structure may be formed at a location spaced apart from an upper surface of the substrate by a first vertical distance, in the second region.

5 Claims, 13 Drawing Sheets

Related U.S. Application Data of application No. 15/826,031, filed on Nov. 29, 2017, now Pat. No. 10,468,103.

(51) Int. Cl.

| | | |
|---|---|---|
| *G11C 14/00* | (2006.01) | |
| *H01L 45/00* | (2006.01) | |
| *H01L 29/08* | (2006.01) | |
| *H01L 27/108* | (2006.01) | |
| *H01L 29/423* | (2006.01) | |
| *H01L 43/08* | (2006.01) | |
| *H01L 43/02* | (2006.01) | |
| *H01L 27/24* | (2006.01) | |
| *H01L 27/22* | (2006.01) | |
| *H01L 27/105* | (2006.01) | |
| *H01L 27/02* | (2006.01) | |
| *G11C 7/10* | (2006.01) | |
| *G11C 11/00* | (2006.01) | |

(52) U.S. Cl.
CPC ........ *G11C 14/009* (2013.01); *G11C 14/0045* (2013.01); *G11C 14/0081* (2013.01); *H01L 23/528* (2013.01); *H01L 27/0207* (2013.01); *H01L 27/1052* (2013.01); *H01L 27/10814* (2013.01); *H01L 27/10823* (2013.01); *H01L 27/10829* (2013.01); *H01L 27/10852* (2013.01); *H01L 27/10876* (2013.01); *H01L 27/10885* (2013.01); *H01L 27/10891* (2013.01); *H01L 27/222* (2013.01); *H01L 27/228* (2013.01); *H01L 27/2436* (2013.01); *H01L 27/2463* (2013.01); *H01L 29/0847* (2013.01); *H01L 29/4236* (2013.01); *H01L 43/02* (2013.01); *H01L 43/08* (2013.01); *H01L 43/12* (2013.01); *H01L 45/04* (2013.01); *H01L 45/06* (2013.01); *H01L 45/1233* (2013.01); *H01L 45/1608* (2013.01)

(58) Field of Classification Search
CPC ......... H01L 43/02; H01L 43/08; H01L 45/06; H01L 45/1233
See application file for complete search history.

(56) References Cited

U.S. PATENT DOCUMENTS

| | | | |
|---|---|---|---|
| 6,358,756 | B1 | 3/2002 | Sandhu et al. |
| 6,894,918 | B2 | 5/2005 | Sharma et al. |
| 7,554,147 | B2 | 6/2009 | Asano et al. |
| 8,243,499 | B2 | 8/2012 | Widjaja |
| 8,934,283 | B2 | 1/2015 | Matsudaira et al. |
| 9,041,220 | B2 | 5/2015 | Henderson et al. |
| 9,589,620 | B1 | 3/2017 | Naeimi |
| 2004/0008542 | A1 | 1/2004 | Sharma et al. |
| 2004/0027733 | A1 | 2/2004 | Matsukawa et al. |
| 2005/0226030 | A1 | 10/2005 | Kato et al. |
| 2006/0211231 | A1* | 9/2006 | Asano ................ H01L 27/2436 438/593 |
| 2008/0137399 | A1 | 6/2008 | Chan et al. |
| 2010/0155852 | A1 | 6/2010 | Piazza et al. |
| 2014/0254254 | A1 | 9/2014 | Katayama et al. |
| 2016/0300612 | A1 | 10/2016 | Manipatruni et al. |
| 2017/0054070 | A1 | 2/2017 | Bak et al. |
| 2017/0125119 | A1 | 5/2017 | Loh et al. |
| 2017/0179977 | A1 | 6/2017 | Kwok |
| 2017/0294226 | A1 | 10/2017 | Yim |
| 2017/0344490 | A1 | 11/2017 | Blagodurov et al. |
| 2018/0181527 | A1 | 6/2018 | Rahal-Arabi et al. |
| 2018/0350905 | A1 | 12/2018 | Yoon et al. |

* cited by examiner

INTEGRATED CIRCUIT DEVICES AND METHODS OF MANUFACTURING SAME

CROSS-REFERENCE TO RELATED APPLICATIONS

This application is a divisional of U.S. application Ser. No. 16/533,143, filed on Aug. 6, 2019, which is a divisional of U.S. application Ser. No. 15/826,031, filed on Nov. 29, 2017, which claims the benefit, under 35 U.S.C. § 119, of Korean Patent Application No. 10-2016-0162915, filed on Dec. 1, 2016, in the Korean Intellectual Property Office, the disclosure of each of which is incorporated herein in its entirety by reference.

BACKGROUND

The inventive concepts relate to integrated circuit (IC) devices and methods of manufacturing the IC devices, and more particularly, to an IC device including different kinds of memory devices in a single chip, and a method of manufacturing the integrated circuit device.

Recently, electronic devices such as smart phones have rapidly become more widespread, and the development and spread of system-in-package (SiP) modules and wearable devices utilizing these SiP modules have been increasing. SiP modules have been obtained by integrating a plurality of individual semiconductor chips performing various functions by interworking with electronic devices into one package. Accordingly, the functions of different products have been mutually complemented or reinforced using any of existing three-dimensional (3D) packaging methods of stacking semiconductor chips in a 3D manner, such as a chip on chip (CoC) bonding method, a chip on wafer (CoW) bonding method, and a wafer on wafer (WoW) bonding method. In some cases, while converging technology is being utilized in various fields, the demand for convergence, intellectualization, and networking of intelligent technology (IT) and miniaturization of apparatuses has been increasing. In addition, the development of a semiconductor chip having various functions that cannot be handled according to existing 3D packaging methods is in demand.

SUMMARY

Some example embodiments of the inventive concepts provide an integrated circuit (IC) device having a structure configured to implement, without using packaging technology, devices configured to perform various functions that satisfy demands for convergence, intellectualization, and networking of intelligent technology (IT) and miniaturization of apparatuses.

Some example embodiments of the inventive concepts provide a method of manufacturing an IC device configured to implement, without using existing packaging technology, devices configured to perform various functions that satisfy demands for convergence, intellectualization, and networking of IT and miniaturization of apparatuses.

In some example embodiments, an integrated circuit (IC) device may include an individual substrate configured to include a single chip and a plurality of memory cells on the substrate. The plurality of memory cells may be spaced apart from each other on the substrate. The plurality of memory cells may have different structures.

In some example embodiments, an integrated circuit (IC) device may include a first memory device on a first region of a substrate, a second memory device on a second region of the substrate, and an interface region on a third region. The first memory device may include a first memory cell array region including a first memory cell associated with a first memory cell type. The second region may be spaced apart from the first region. The second memory device may include a second memory cell array region. The second memory cell array region may include a second memory cell associated with a second memory cell type. The second memory cell type may be different from the first memory cell type. The third region may be spaced apart from the first region and the second region. The interface region may include a plurality of conductive lines configured to electrically couple the first memory cell array region with the second memory cell array region.

In some example embodiments, a method of manufacturing an integrated circuit (IC) device may include forming a plurality of first word lines in a substrate, in a first region of the substrate, forming a plurality of second word lines at the substrate in a separate, second region of the substrate, forming a plurality of capacitors on the plurality of first word lines in the first region, forming a plurality of source lines on the plurality of second word lines in the second region, forming an insulation layer covering the plurality of capacitors in the first region and the plurality of source lines in the second region, and forming a variable resistance structure at a location spaced apart from an upper surface of the substrate by a first vertical distance, in the second region.

In some example embodiments, an integrated circuit (IC) device may include a first memory device on a first region of a substrate and a second memory device on a second region of the substrate. The first memory device may include a first multi-layered wiring structure. The second region of the substrate may be isolated from the first region by an isolation layer at the substrate. The second memory device may include a second multi-layered wiring structure. At least one layer of the first multi-layered wiring structure may be coplanar with at least one layer of the second multi-layered wiring structure.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
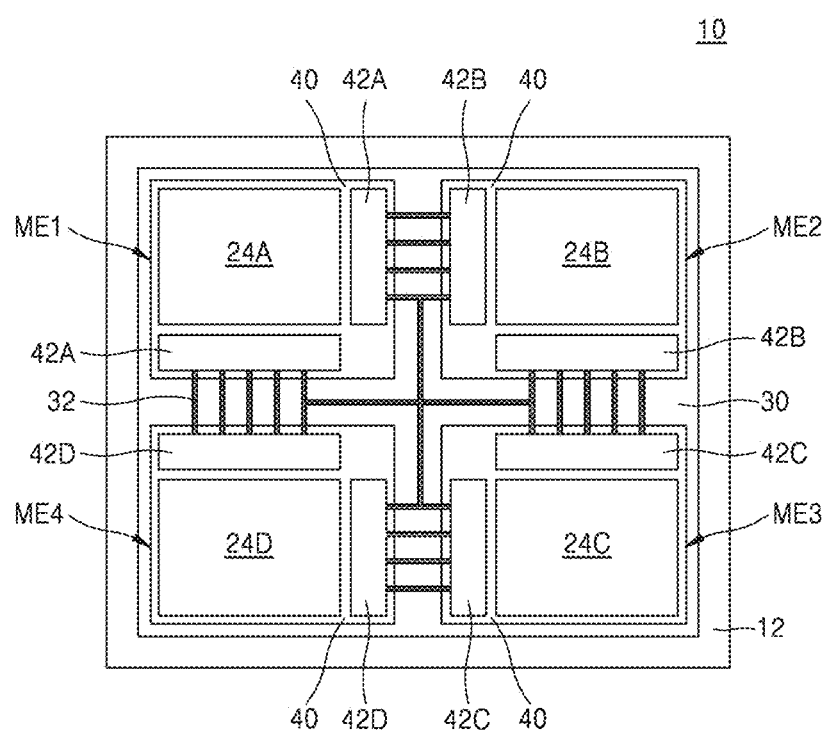
FIG. 1 is a schematic plan view of an integrated circuit (IC) device according to some example embodiments of the inventive concepts.

Hereinafter, the inventive concepts will be described more fully with reference to the accompanying drawings, in which some example embodiments of the inventive concepts are shown. Like reference numerals in the drawings denote like elements, and thus their description will be omitted.

FIG. 1 is a schematic plan view of an integrated circuit (IC) device 10 according to some example embodiments of the inventive concepts.

The IC device 10 includes a single substrate 12 including a single ("individual") chip, and a plurality of memory cell regions 24A, 24B, 24C, and 24D respectively arranged apart (e.g., isolated from direct contact with each other) in mutually-spaced regions on the substrate 12. At least two regions of the plurality of memory cell regions 24A, 24B, 24C, and 24D may include unit memory cells having different structures.

According to some example embodiments, each region of the plurality of memory cell regions 24A, 24B, 24C, and 24D may be a memory cell region of dynamic random access memory (DRAM), a memory cell region of magnetic RAM (MRAM), a memory cell region of static RAM (SRAM), a memory cell region of phase change RAM (PRAM), a memory cell region of resistance RAM (RRAM), or a memory cell region of ferroelectric RAM (FRAM). Each region of the plurality of memory cell regions 24A, 24B, 24C, and 24D may include a DRAM memory cell, an MRAM memory cell, an SRAM memory cell, a PRAM memory cell, an RRAM memory cell, or a FRAM memory cell.

At least two regions of the plurality of memory cell regions 24A, 24B, 24C, and 24D may be different kinds ("types") of memory cell regions. According to some example embodiments, one region of the plurality of memory cell regions 24A, 24B, 24C, and 24D may include a volatile memory device, and another region of the plurality of memory cell regions 24A, 24B, 24C, and 24D may include a nonvolatile memory device. According to some example embodiments, one region of the plurality of memory cell regions 24A, 24B, 24C, and 24D may include a unit memory cell having a transistor and a capacitor, and another region of the plurality of memory cell regions 24A, 24B, 24C, and 24D may include a unit memory cell having a switch and a variable resistor.

For example, one region of the plurality of memory cell regions 24A, 24B, 24C, and 24D may include a DRAM device including a plurality of DRAM memory cells, and another region of the plurality of memory cell regions 24A, 24B, 24C, and 24D may include an MRAM device including a plurality of MRAM memory cells.

A plurality of peripheral circuit regions 40 may each be arranged (e.g., may extend) around a separate region of the plurality of memory cell regions 24A, 24B, 24C, and 24D, respectively. The plurality of peripheral circuit regions 40 may each include a separate region of the plurality of local peripheral circuit regions 42A, 42B, 42C, and 42D that are spaced apart from one another. The plurality of local peripheral circuit regions 42A, 42B, 42C, and 42D may be a core region or peripheral circuit regions (hereinafter, only referred to as peripheral circuit regions) in which peripheral circuits associated with driving the plurality of memory cell regions 24A, 24B, 24C, and 24D, for example, various circuits for controlling input or output of information to or from the plurality of memory cell regions 24A, 24B, 24C, and 24D, are arranged.

The memory cell region 24A and the local peripheral circuit region 42A may at least partially comprise a first memory device ME1, the memory cell region 24B and the local peripheral circuit region 42B may at least partially comprise a second memory device ME2, the memory cell region 24C and the local peripheral circuit region 42C may at least partially comprise a third memory device ME3, and the memory cell region 24D and the local peripheral circuit region 42D may at least partially comprise a fourth memory device ME4. At least two devices of the first through fourth memory devices ME1, ME2, ME3, and ME4 may be different kinds ("types") of memory devices including different types of memory cells. For example, each device of the first through fourth memory devices ME1, ME2, ME3, and ME4 may be one kind of device selected from a DRAM device, an MRAM device, an SRAM device, a PRAM device, an RRAM device, and an FRAM device, and at least two devices of the first through fourth memory devices ME1, ME2, ME3, and ME4 may include different devices selected from a DRAM device, an MRAM device, an SRAM device, a PRAM device, an RRAM device, and an FRAM device.

An interface region 30 including a plurality of conductive lines 32 enabling the first through fourth memory devices ME1, ME2, ME3, and ME4 to be electrically connected to each other may be disposed between the first through fourth memory devices ME1, ME2, ME3, and ME4. In the interface region 30, the plurality of conductive lines 32 may be configured to enable electrical connection between the plurality of memory cell regions 24A, 24B, 24C, and 24D and/or electrical connection between the plurality of local peripheral circuit regions 42A, 42B, 42C, and 42D.

Although the IC device 10 includes the first through fourth memory devices ME1, ME2, ME3, and ME4 and the interface region 30 is located between the first through fourth memory devices ME1, ME2, ME3, and ME4 in FIG. 1, the inventive concepts is not limited thereto. For example, the IC device 10 may include at least two memory devices, and the number ("quantity") of memory devices included in the IC device 10 is not particularly limited. Although the interface region 30 disposed between the first through fourth memory devices ME1, ME2, ME3, and ME4 is a single region in FIG. 1, the inventive concepts are not limited thereto. For example, a plurality of separated interface regions are arranged on the substrate 12, each of the plurality of interface regions may include at least one conductive line 32, and the plurality of interface regions may be appropriately distributed at predetermined locations between the first through fourth memory devices ME1, ME2, ME3, and ME4.

Although the plurality of local peripheral circuit regions 42A, 42B, 42C, and 42D are each arranged around a separate region of the plurality of memory cell regions 24A, 24B, 24C, and 24D on the substrate 12 and the plurality of local peripheral circuit regions 42A, 42B, 42C, and 42D are spaced apart from one another within the plurality of peripheral circuit regions 40 in FIG. 1, the inventive concepts are not limited thereto. For example, local peripheral circuits included in at least two of the first through fourth memory devices ME1, ME2, ME3, and ME4 may co-exist within an individual local region selected from the plurality of peripheral circuit regions 40.

According to some example embodiments, at least one device of the first through fourth memory devices ME1, ME2, ME3, and ME4 may be a DRAM device.

Figure 2:
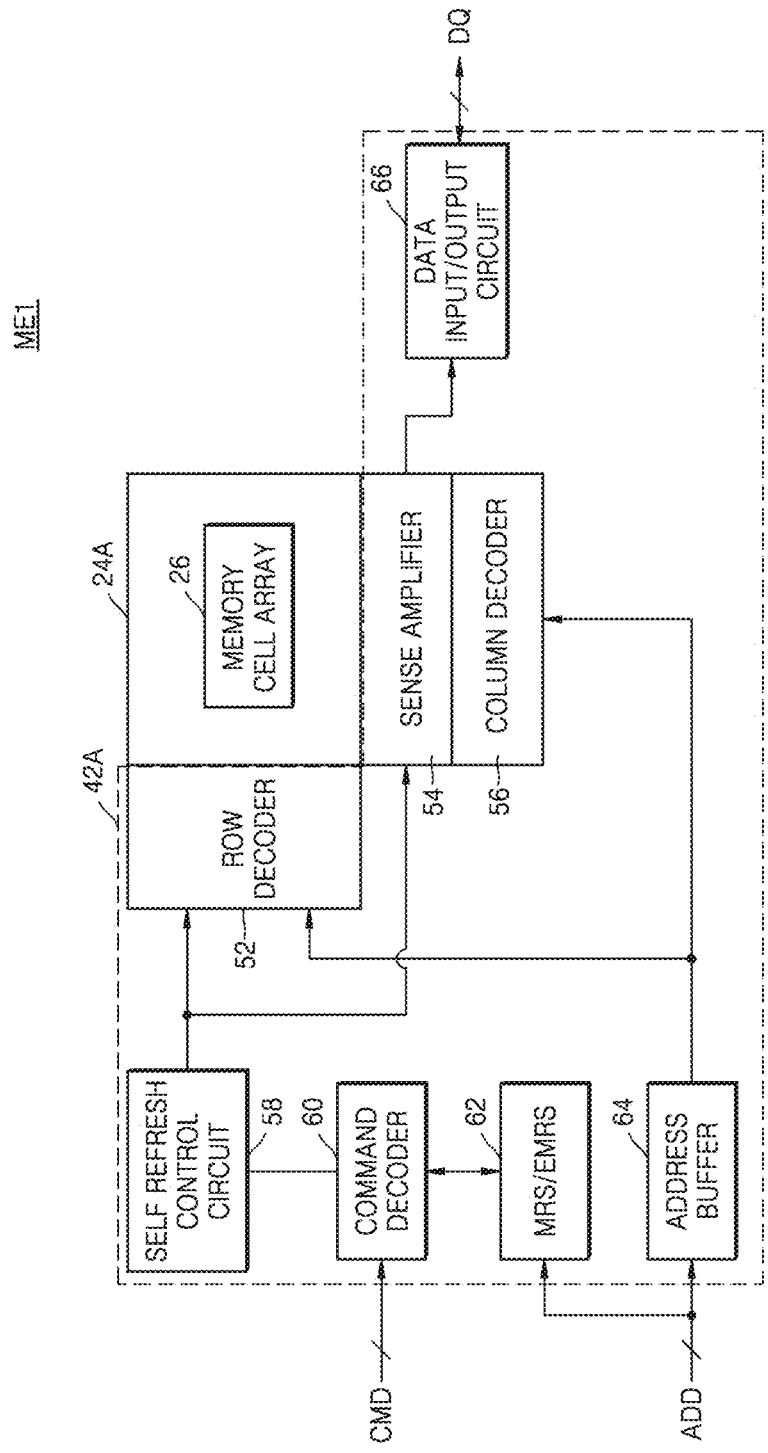
FIG. 2 is a block diagram for explaining a structure of a first memory device of an IC device according to some example embodiments of the inventive concepts.

FIG. 2 is a block diagram of a structure of the first memory device ME1 of FIG. 1. FIG. 2 illustrates an example in which the first memory device ME1 is a DRAM device.

Referring to FIG. 2, the first memory device ME1 may include a memory cell region 24A and a local peripheral circuit region 42A. The memory cell region 24A may include a memory cell array 26. The local peripheral circuit region 42A may include a row decoder 52, a sense amplifier 54, a column decoder 56, a self-refresh control circuit 58, a command decoder 60, a Mode Register Set/Extended Mode Register Set (MRS/EMRS) circuit 62, an address buffer 64, and a data input/output circuit 66.

The memory cell array 26 may include a plurality of memory cells configured to store data. The memory cells may be arranged in a row direction and a column direction (e.g., in a two-dimensional array of cells). Each cell of the plurality of memory cells may include a cell capacitor and an access transistor. A gate of the access transistor may be connected to a word line corresponding to the gate among the plurality of word lines arranged in a row direction, one of a source and a drain thereof may be connected to a bit line or a complementary bit line BL arranged in a column direction, and the other may be connected to the cell capacitor.

The sense amplifier 54 may sense and amplify data of a memory cell and may store the data in the memory cell. The sense amplifier 54 may be implemented as a cross-coupled amplifier connected between a bit line and a complementary bit line included in the memory cell array 26.

Data DQ input via the data input/output circuit 66 may be written to the memory cell array 26 based on an address signal ADD, and data DQ read from the memory cell array 26 based on the address signal ADD may be output to the outside via the data input/output circuit 66. To designate a memory cell to or from which data is written or read, the address signal ADD may be input to the address buffer 64. The address buffer 64 may temporarily store an address signal ADD input from an external source.

The row decoder 52 may decode a row address from the address signal ADD output from the address buffer 64, in order to designate a word line connected to the memory cell to or from which data is written or read. In other words, the row decoder 52 may enable the word line by decoding the row address output from the address buffer 64 in a data write or read mode. The row decoder 52 may enable the word line by decoding a row address generated from an address counter in a self-refresh mode.

The column decoder 56 may decode a column address from the address signal ADD output from the address buffer 64, in order to designate a bit line connected to the memory cell to or from which data is written or read.

The memory cell array 26 may output data from a memory cell designated by the row and column addresses, or may write data to the memory cell.

The command decoder 60 may receive command signals CMD from an external source and decode the received command signals CMD to generate decoded command signals, for example, a self-refresh enter command and a self-refresh exit command.

The MRS/EMRS circuit 62 may set all internal resistors in response to an MRS/EMRS command for designating an operation mode of the first memory device ME1 and the address signal ADD.

Although not shown in FIG. 2, the first memory device ME1 may further include, for example, a clock circuit configured to generate a clock signal and a power circuit configured to receive a power voltage from an external source and generate or supply an internal voltage.

The self-refresh control circuit 58 may control a self-refresh operation of the first memory device ME1, in response to a command output by the command decoder 60.

The command decoder 60 may include an address counter, a timer, and a core voltage generator. The address counter may generate a row address that is a target of self-refresh, in response to the self-refresh enter command output by the command decoder 60, and may apply the row address to the row decoder 52. The address counter may stop a counting operation in response to the self-refresh exit command output by the command decoder 60.

Figure 3:
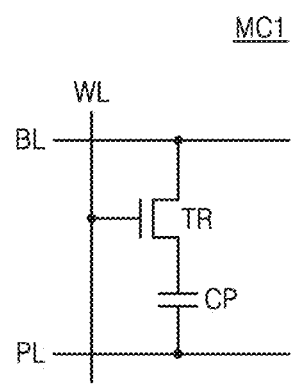
FIG. 3, FIG. 4, FIG. 5, FIG. 6, FIG. 7, and FIG. 8 are equivalent circuit diagrams of unit memory cells configured to at least partially comprise a memory cell array of an IC device according to some example embodiments of the inventive concepts.

FIG. 3 is an equivalent circuit diagram of a unit memory cell MC1 configured to at least partially comprise the memory cell array 26 of FIG. 2.

Referring to FIG. 3, the unit memory cell MC1 includes a single transistor TR and a single capacitor CP. Two states may be distinguished from each other according to existence or absence of charge stored in a capacitor CP, and the capacitor CP may be configured to serve as a memory element. A gate of the transistor TR is connected to a word line WL, a drain of the transistor TR is connected to one terminal of the capacitor CP, and a source of the transistor TR is connected to a bit line BL. The other terminal of the capacitor CP is connected to a plate line PL.

Referring back to FIG. 1, according to some example embodiments, at least one of the first through fourth memory devices ME1, ME2, ME3, and ME4 may be an MRAM device.

Figure 4:
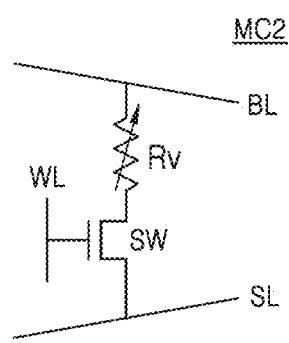

FIG. 4 is an equivalent circuit diagram of a unit memory cell MC2 configured to at least partially comprise a memory cell array included in the memory cell region 24B of the second memory device ME2 when the second memory device ME2 is an MRAM device.

Referring to FIG. 4, the unit memory cell MC2 may include a source line SL, a switch SW, a word line WL, a variable resistor Rv, and a bit line BL. The switch SW may include a transistor. When a voltage is applied to the word line WL and thus the switch SW is turned on, a current may be provided from the source line SL to the bit line BL via the variable resistor Rv. Depending on a resistance value of the variable resistor Rv, the amount of current supplied to the bit line BL may vary.

Referring back to FIG. 1, according to some example embodiments, one of the first through fourth memory devices ME1, ME2, ME3, and ME4 may be an RRAM device.

Figure 5:
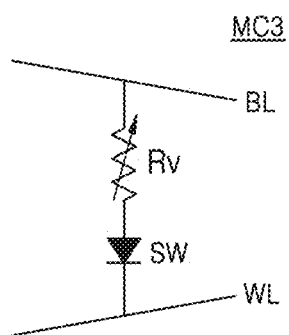

FIG. 5 is an equivalent circuit diagram of a unit memory cell MC3 of a memory cell array of an RRAM device configured to at least partially comprise at least one device of the first through fourth memory devices ME1, ME2, ME3, and ME4.

Referring to FIG. 5, the unit memory cell MC3 may include a word line WL, a switch SW, a variable resistor Rv, and a bit line BL. The switch SW may include a diode. The variable resistor Rv may serve as a memory element.

Figure 6:
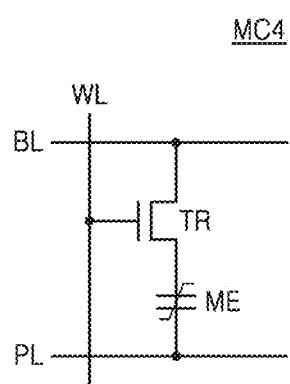

FIG. 6 is an equivalent circuit diagram of a unit memory cell MC4 of a memory cell array of an FRAM device configured to at least partially comprise at least one device of the first through fourth memory devices ME1, ME2, ME3, and ME4.

Referring to FIG. 6, the unit memory cell MC4 may have a similar structure to the unit memory cell MC1 of the DRAM device of FIG. 3. However, in contrast with the unit memory cell MC1, the unit memory cell MC4 may include a memory element ME formed of a ferroelectric material configured to maintaining dielectric polarization characteristics even when power is interrupted.

Figure 7:
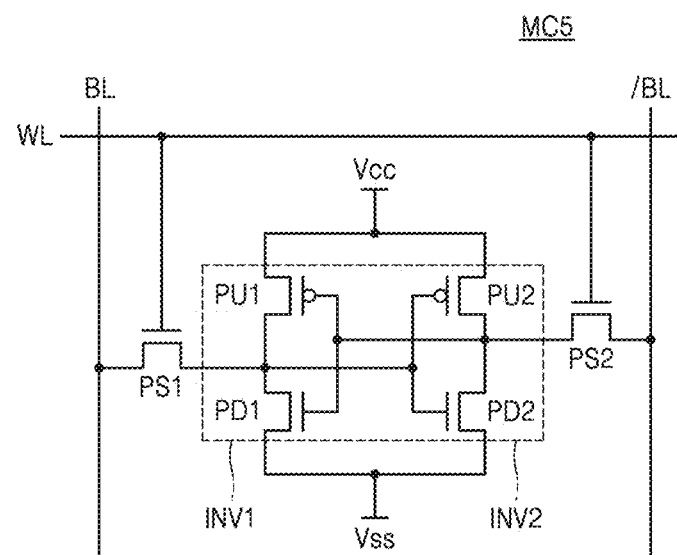

FIG. 7 is an equivalent circuit diagram of a unit memory cell MC5 of a memory cell array of an SRAM device configured to at least partially comprise at least one device of the first through fourth memory devices ME1, ME2, ME3, and ME4.

Referring to FIG. 7, the unit memory cell MC5 may include a pair of inverters, i.e., first and second inverters INV1 and INV2, connected in parallel between a power node Vcc and a ground node Vss, and a first pass transistor PS1 and a second pass transistor PS2 respectively connected to output nodes of the first and second inverters INV1 and INV2. The first pass transistor PS1 and the second pass transistor PS2 may be respectively connected to a bit line BL and a complementary bit line/BL. Gates of the first pass transistor PS1 and the second pass transistor PS2 may be connected to a word line WL.

The first inverter INV1 may include a first pull-up transistor PU1 and a first pull-down transistor PD1 serially connected to each other, and the second inverter INV2 includes a second pull-up transistor PU2 and a second pull-down transistor PD2 serially connected to each other. The first pull-up transistor PU1 and the second pull-up transistor PU2 may include PMOS transistors, and the first pull-down transistor PD1 and the second pull-down transistor PD2 may include NMOS transistors. In order for the first inverter INV1 and the second inverter INV2 to at least partially comprise a single latch circuit, an input node of the first inverter INV1 may be connected to the output node of the second inverter INV2, and an input node of the second inverter INV2 may be connected to the output node of the first inverter INV1.

Figure 8:
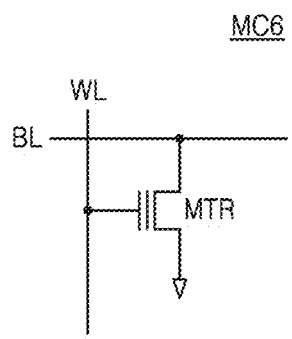

FIG. 8 is an equivalent circuit diagram of a unit memory cell MC6 of a memory cell array of a nonvolatile memory device configured to constituting at least one of the first through fourth memory devices ME1, ME2, ME3, and ME4.

Referring to FIG. 8, the unit memory cell MC6 includes a memory transistor MTR. The memory transistor MTR may be a floating trap type (such as, SONOS) transistor or a floating gate type (such as, flash memory) transistor. A control gate of the memory transistor MTR is connected to a word line WL, a source of the memory transistor MTR is grounded, and a drain of the memory transistor MTR is connected to a bit line BL.

The structure of a unit memory cell at least partially comprise the first through fourth memory devices ME1, ME2, ME3, and ME4 of FIG. 1 is not limited to only the equivalent circuit structures of FIGS. 3-8, and may include a memory device having any of various types of equivalent circuit structures that do not depart from the technical spirit and scope of the inventive concepts.

For example, one device of the first through fourth memory devices ME1, ME2, ME3, and ME4 may be a DRAM device having an equivalent circuit structure of the unit memory cell MC1 of FIG. 3, and another device of the first through fourth memory devices ME1, ME2, ME3, and ME4 may be an MRAM device having an equivalent circuit structure of the unit memory cell MC2 of FIG. 4.

Figure 9:
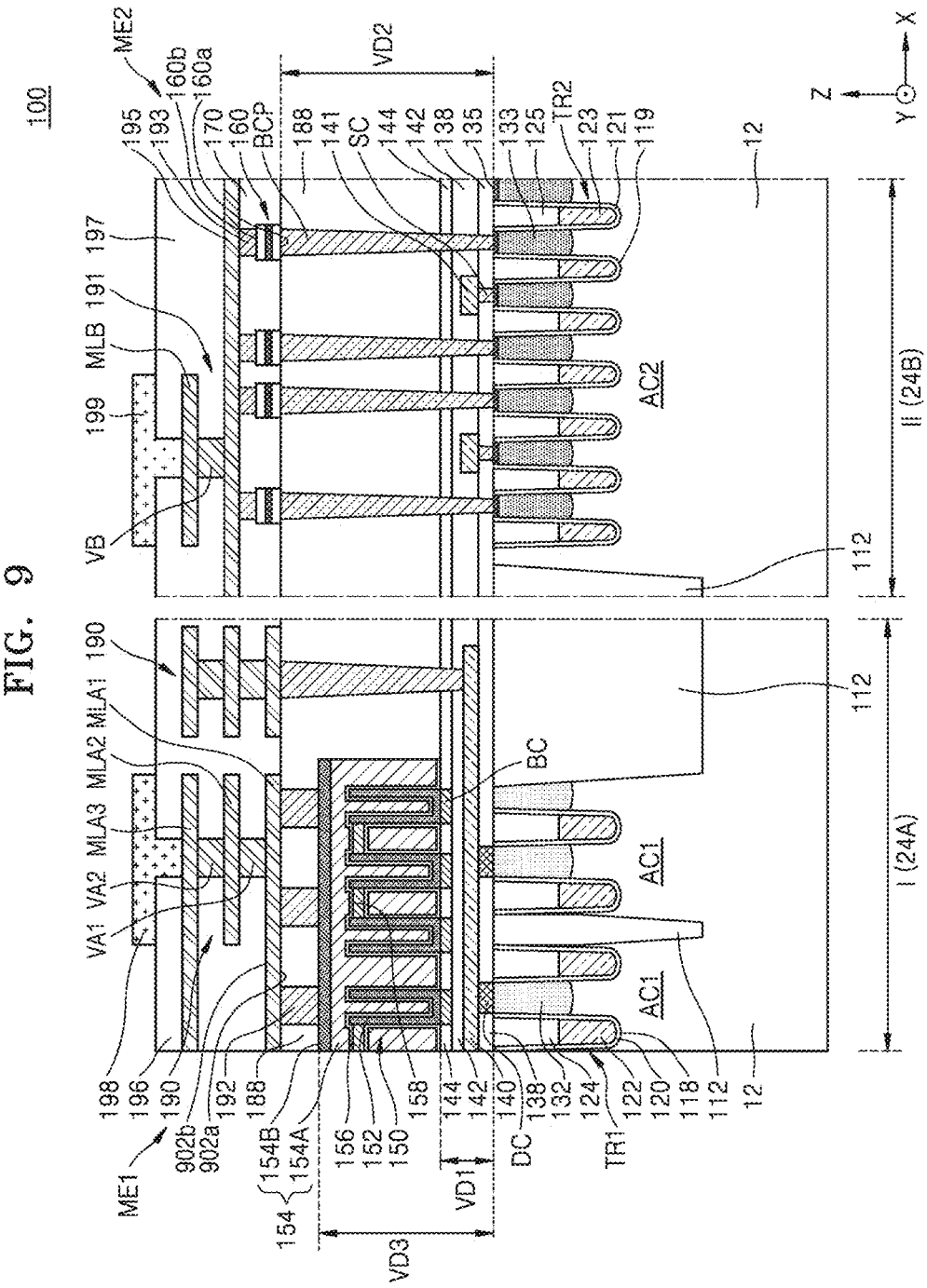
FIG. 9 is a cross-sectional view for explaining an IC device according to some example embodiments of the inventive concepts.

FIG. 9 is a cross-sectional view for explaining an IC device 100 according to some example embodiments of the inventive concepts. In FIG. 9, same reference numerals and characters indicate same members.

Referring to FIG. 9, a substrate 12 of the IC device 100 includes a first region I and a second region II that are spaced apart from each other. The IC device 100 includes a first memory device ME1 disposed on the first region I of the substrate 12, and a second memory device ME2 disposed on a second region II of the substrate 12. The first memory device ME1 may be a DRAM device, and the second memory device ME2 may be an MRAM device.

Accordingly, a memory cell region 24A of the DRAM device may be disposed on the first region I of the substrate 12, and the memory cell region 24B of the MRAM device may be disposed on the second region II of the substrate 12. However, embodiments of the inventive concepts are not limited to the example of FIG. 9. For example, the first and second regions I and II may be different two regions selected from the plurality of memory cell regions 24A, 24B, 24C, and 24D of FIG. 1.

According to some example embodiments, the substrate 12 may include a semiconductor such as Si or Ge, or a compound semiconductor such as SiGe, SiC, GaAs, InAs, or InP. The substrate 12 may include a conductive region, for example, an impurity-doped well or an impurity-doped structure.

The substrate 12 includes a plurality of first active regions AC1 and a plurality of second active regions AC2 spaced apart from each other with an isolation layer 112 interposed therebetween. Although only one of the plurality of second active regions AC2 is illustrated in FIG. 9 for a simple explanation, a plurality of second active regions AC2 arranged parallel to each other in an X direction may be defined by isolation layers 112 in the second region II.

A memory cell region of a DRAM device is formed on the plurality of first active regions AC1 in the first region I, and a memory cell region of an MRAM device is formed on the plurality of second active region AC2 in the second region II. In the first region I, each of the plurality of first active regions AC1 may have a planar structure in an island shape having a long axis intersecting with X and Y directions and a short axis perpendicular to the long axis.

The first memory device ME1 may include a plurality of first transistors TR1 buried in the substrate 12, within the first region I. To this end, a plurality of first gate dielectric layers 120, a plurality of first word lines 122, and a plurality of first buried insulation layers 124 may be sequentially formed within a plurality of first word line trenches 118 formed in the first region I of the substrate 12. The plurality of first word lines 122 may be used as first gate electrodes of the plurality of first transistors TR1. The plurality of first transistors TR1 include a plurality of first source/drain regions 132 extending from both sides of each of the plurality of first word lines 122 to an upper surface of the substrate 12. Each of the plurality of first source/drain regions 132 may be an impurity-doped region.

The second memory device ME2 may include a plurality of second transistors TR2 buried in the substrate 12, within the second region II. To this end, a plurality of second gate dielectric layers 121, a plurality of second word lines 123, and a plurality of second buried insulation layers 125 may be sequentially formed within a plurality of second word line trenches 119 formed in the second region II of the substrate 12. The plurality of second word lines 123 buried in the substrate 12 may be used as second gate electrodes of the plurality of second transistors TR2. The plurality of second transistors TR2 include a plurality of second source/drain regions 133 extending from both sides of each of the plurality of second word lines 123 to the upper surface of the substrate 12. Each of the plurality of second source/drain regions 133 may be an impurity-doped region. According to some example embodiments, an impurity-doping concentration in the plurality of second source/drain regions 133 may be equal to that in the plurality of first source/drain regions 132 formed in the first region I. According to some example embodiments, an impurity-doping concentration in the plurality of second source/drain regions 133 may be greater than that in the plurality of first source/drain regions 132 formed in the first region I.

The plurality of first and second gate dielectric layers 120 and 121 may be at least one selected from a silicon oxide layer, a silicon nitride layer, a silicon oxynitride layer, an oxide/nitride/oxide (ONO), or a high-k dielectric film having a greater dielectric constant than a silicon oxide layer. The plurality of first and second word lines 122 and 123 may at least partially comprise at least one material selected from among Ti, TiN, Ta, TaN, W, WN, TiSiN, and WSiN. The plurality of first and second buried insulation layers 124 and 125 may each be a silicon oxide layer, a silicon nitride layer, a silicon oxynitride layer, or a combination thereof.

In the first region I, a bit line 140 connected to the first active regions AC1 of the substrate 12 via a direct contact DC may be formed on the substrate 12. The bit line 140 may be spaced from the substrate 12 by interposing a buffer insulation layer 138, surrounding the direct contact DC, between the bit line 140 and the substrate 12. The direct contact DC may at least partially comprise polysilicon, metal, conductive metal nitride, or a combination thereof. The bit line 140 may include at least one selected from impurity-doped semiconductor, metal, conductive metal nitride, or metal silicide. For example, the bit line 140 may at least partially comprise doped polysilicon, TiN, TiSiN, W, tungsten silicide, or a combination thereof. The buffer insulation layer 138 may be an oxide layer, a nitride layer, or a combination thereof.

A plurality of buried contacts BC may be formed on a first insulation layer 142 covering the bit line 140. The plurality of buried contacts BC may be connected to the first active regions AC1 of the substrate 12 in a cross-section other than the cross-section of FIG. 9. The plurality of buried contacts BC may be insulated from one another by a second insulation layer 144. The plurality of buried contacts BC may at least partially comprise impurity-doped semiconductor, metal, conductive metal nitride, or a combination thereof. The first and second gate insulation layers 142 and 144 may each be an oxide layer, a nitride layer, or a combination thereof.

In the second region II, a metal silicide layer 135 may be formed on an upper surface of each of the plurality of second source/drain regions 133. The metal silicide layers 135 may reduce contact resistance between the second source/drain regions 133 and upper conductive layers connected to the second source/drain regions 133, for example, a source line contact plug SC or a buried contact plug BCP. According to some example embodiments, the metal silicide layers 135 may not be formed.

In the second region II, a plurality of source line contact plugs SC are formed on some of the second source/drain regions 133. The plurality of source line contact plugs SC may be insulated from one another by the buffer insulation layer 138.

In the second region II, a plurality of source lines 141 may be formed on the buffer insulation layer 138. Each of the plurality of source lines 141 may be connected to a second source/drain region 133 formed between a pair of second word lines 123 via a source line contact plug SC. Although the plurality of source lines 141 are formed on the substrate 12 in FIG. 9, the inventive concepts are not limited thereto. According to some example embodiments, the second memory device ME2 of the IC device 100 may include a plurality of source lines buried in the substrate 12, instead of the plurality of source lines 141 formed on the substrate 12. For example, the second memory device ME2 of the IC device 100 may include a plurality of source lines located at a level that is higher than a pair of second word lines 123 and is lower than an upper surface of the substrate 12. For example, the plurality of source lines 141 may each extend parallel to the plurality of second word lines 123. As another example, the plurality of source lines 141 may each extend in a direction intersecting with a direction in which each of the plurality of second word lines 123 extends.

The first insulation layer 142 and the second insulation layer 144 may be sequentially formed on the plurality of source lines 141. The plurality of source lines 141 may be insulated from one another by the first insulation layer 142.

In the first region I, a plurality of capacitors 150 connected to the plurality of buried contacts BC are formed on the second insulation layer 144. Each of the plurality of capacitors 150 includes a lower electrode 152, an upper electrode 154, and a dielectric layer 156 interposed between the lower and upper electrodes 152 and 154. The lower electrode 152 of each of the plurality of capacitors 150 may be supported by an insulation support 158.

The lower electrode 152 may at least partially comprise metal, conductive metal nitride, or a combination thereof. For example, the lower electrode 152 may at least partially comprise TiN, Ru, TaN, WN, Pt, Jr, or a combination thereof. The dielectric layer 156 may be a metal oxide layer having a greater dielectric constant than a silicon oxide layer. For example, the dielectric layer 156 may at least partially comprise tantalum oxide ($Ta_2O_5$), aluminum oxide ($Al_2O_3$), titanium oxide ($TiO_2$), or a combination thereof, but is not limited thereto. The insulation support 158 may at least partially comprise $SiO_2$, $Si_3N_4$, SiCN, SiOC, SiON, SiOCN, or a combination thereof. The upper electrode 154 may at least partially comprise a metal or nonmetal conductive material. According to some example embodiments, the upper electrode 154 may at least partially comprise SiGe, W, Ti, Ru, conductive metal nitride, metal silicide, or a combination thereof. The upper electrode 154 may be a double layer formed of a first conductive layer 154A and a second conductive layer 154B. However, the inventive concepts are not limited thereto. The upper electrode 154 may be a single layer or a multilayer corresponding to a stack of at least two conductive layers.

In the first region I, the plurality of capacitors 150 may be covered with a third insulation layer 188. A multi-layered wiring structure 190 is formed on the third insulation layer 188. The multi-layered wiring structure 190 includes a plurality of conductive lines MLA1, MLA2, and MLA3 extending in parallel to a main surface extending direction of the substrate 12 at different levels, and a plurality of via contacts VA1 and VA2 for connecting the plurality of conductive lines MLA1, MLA2, and MLA3 at different levels to each other. The plurality of via contacts VA1 and VA2 may include a via contact VA1 connecting the conductive line MLA1, which is on a wiring layer level closest to the substrate 12 from among the plurality of conductive lines MLA1, MLA2, and MLA3, to the conductive line MLA2, which is on a wiring layer level second closest to the substrate 12 from among the plurality of conductive lines MLA1, MLA2, and MLA3, and a via contact VA2 connecting the conductive line MLA2, which is on the wiring layer level second closest to the substrate 12, to the conductive line MLA3, which is on a wiring layer level third closest to the substrate 12 from among the plurality of conductive lines MLA1, MLA2, and MLA3. The multi-layered wiring structure 190 may be insulated from other adjacent lines by a fourth insulation layer 196. The third and fourth insulation layers 188 and 196 may each be an oxide layer, a nitride layer, or a combination thereof. A plurality of contact plugs 192 penetrating through the third insulation layer 188 are formed between the plurality of capacitors 150 and the multi-layered wiring structure 190.

Each of the plurality of conductive lines MLA1, MLA2, and MLA3 and the plurality of via contacts VA1 and VA2, which include the multi-layered wiring structure 190, may include at least one material from metal, conductive metal nitride, a metal-semiconductor compound, and doped semiconductor. According to some example embodiments, the plurality of conductive lines MLA1, MLA2, and MLA3 and the plurality of via contacts VA1 and VA2 may include a barrier layer formed of Ta, Ti, TaN, TiN, or a combination thereof, and a metal layer, for example, a W, Al, or Cu layer, formed on the barrier layer. According to some example embodiments, the plurality of conductive lines MLA1, MLA2, and MLA3 may at least partially comprise the same material as that used to form the plurality of via contacts VA1 and VA2. According to some example embodiments, at least some of the plurality of conductive lines MLA1, MLA2, and MLA3 may include different materials from the plurality of via contacts VA1 and VA2.

In the first region I, a contact pad 198 is connected to an uppermost line included in the multi-layered wiring structure 190. Although the single contact pad 198 is illustrated in FIG. 9, the inventive concepts are not limited thereto. For example, the first memory device ME1 formed in the first region I may include a plurality of contact pads 198. According to some example embodiments, the plurality of contact pads 198 may at least partially comprise Al.

In the second region II, a plurality of buried contact plugs BCP penetrating through the buffer insulation layer 138 and the first through third insulation layers 142, 144, and 188 are formed on the substrate 12. The plurality of buried contact plugs BCP may be respectively connected to second source/drain regions 133 selected from the plurality of second source/drain regions 133, via the metal silicide layers 135. The plurality of buried contact plugs BCP may at least partially comprise at least one of metal, conductive metal nitride, a metal-semiconductor compound, and doped polysilicon.

In the second region II, a plurality of variable resistance structures 160 connected to the plurality of buried contact plugs BCP are formed on the third insulation layer 188. The plurality of variable resistance structures 160 may be insulated from one another by interposing a fifth insulation layer 170 therebetween. The fifth insulation layer 170 may be an oxide layer, a nitride layer, or a combination thereof. The plurality of variable resistance structures 160 may be connected to the plurality of second source/drain regions 133 via the plurality of buried contact plugs BCP.

Figure 10:
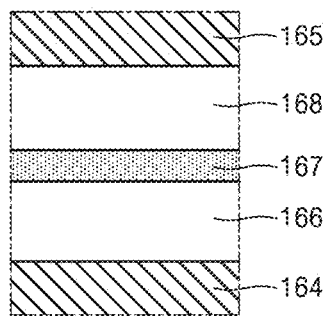
FIG. 10 is a cross-sectional view for explaining a structure of a variable resistance structure included in an IC device according to some example embodiments of the inventive concepts.

FIG. 10 is a cross-sectional view for explaining a structure of each variable resistance structure 160 formed in the second region II of the substrate 12 within the IC device 100 of FIG. 9.

Referring to FIG. 10, the variable resistance structure 160 may include a lower electrode 164, an upper electrode 165, and a first magnetization layer 166, a tunnel barrier layer 167, and a second magnetization layer 168 sequentially stacked between the lower electrode 164 and the upper electrode 165. According to some example embodiments, one layer of the first magnetization layer 166 and the second magnetization layer 168 may include a fixed layer, and the other may include a free layer. According to some example embodiments, the first magnetization layer 166 or the second magnetization layer 168 may include at least one fixed layer and at least one free layer. The fixed layer has a magnetization easy axis in a direction perpendicular to a surface of a film that includes the fixed layer, and a magnetization direction of the fixed layer is fixed. The free layer has a magnetization easy axis in a direction perpendicular to a surface of a film that includes the free layer, and a magnetization direction of the free layer varies according to conditions. Although the single tunnel barrier layer 167 is illustrated in FIG. 10, a plurality of tunnel barrier layers may be included between the lower electrode 164 and the upper electrode 165.

A resistance value of a magnetic tunnel junction of the variable resistance structure 160 may vary depending on a magnetization direction of each layer of the first magnetization layer 166 and the second magnetization layer 168. For example, based on the magnetization directions of the first and second magnetization layers 166 and 168 being antiparallel, the variable resistance structure 160 may have a relatively high resistance value and may store data '1'. Based on the magnetization directions of the first and second magnetization layers 166 and 168 being parallel, the variable resistance structure 160 may have a relatively low resistance value and may store data '0'. Based on using a difference between these resistance values, the second memory device ME2 formed in the second region II may write/read data thereto/therefrom.

According to some example embodiments, the variable resistance structure 160 may be used to implement a vertical magnetization type of magnetic tunnel junction (MTJ) device. According to some example embodiments, the magnetization direction of the free layer of in the variable resistance structure 160 may vary according to a spin transfer torque (STT). According to some example embodiments, the variable resistance structure 160 may include a horizontal MTJ structure in which a current-moving direction and a magnetization easy axis are substantially perpendicular to each other.

The lower electrode 164 and the upper electrode 165 of the variable resistance structure 160 may include a conductive material having relatively low reactivity. According to some example embodiments, the lower electrode 164 and the upper electrode 165 may include conductive metal nitride. For example, each of the lower electrode 164 and the upper electrode 165 may have a single layer structure formed of at least one of Ti, Ta, Ru, TiN, TaN, and W, or a multilayer structure including a plurality of materials. The tunnel barrier layer 167 may have a thickness that is less than a spin diffusion distance. The tunnel barrier layer 167 may include a non-magnetic material. According to some example embodiments, the tunnel barrier layer 167 may at least partially comprise an oxide of a material selected from Mg, Ti, Al, MgZn, and MgB. According to some example embodiments, the tunnel barrier layer 167 may at least partially comprise Ti nitride or vanadium (V) nitride. In the variable resistance structure 160, at least one layer of the first magnetization layer 166 and the second magnetization layer 168 may include at least one of Fe, Co, Ni, Pd, and Pt. According to some example embodiments, at least one layer of the first magnetization layer 166 and the second magnetization layer 168 may further include at least one of B, C, Cu, Ag, Au, Ru, Ta, and Cr. According to some example embodiments, at least one layer of the first magnetization layer 166 and the second magnetization layer 168 may include a perpendicular magnetic anisotropy (PMA) material. According to some example embodiments, at least one layer of the first magnetization layer 166 and the second magnetization layer 168 may have a synthetic anti-ferromagnet (SAF) structure. For example, the SAF structure may have a multi-layered structure of CoFeB/Ta/(Co/Pt)$_m$/Ru/(Co/Pd). (where m and n are natural numbers). However, the inventive concepts are not limited thereto.

In the second region II, a multi-layered wiring structure 191 is formed on the plurality of variable resistance structures 160. The multi-layered wiring structure 191 may include a plurality of contact plugs 193, a bit line 195, a conductive line MLB, and a via contact VB. The plurality of contact plugs 193 may connect the plurality of variable resistance structures 160 to the bit line 195. The via contact VB may connect the bit line 195 to the conductive line MLB. The multi-layered wiring structure 191 may be insulated from other adjacent lines by a sixth insulation layer 197.

The bit line 195 disposed in the second region II may be formed on the same level as the conductive line MLA2 disposed on the wiring layer level second-closest to the substrate 12 from among the plurality of conductive lines MLA1, MLA2, and MLA3 of the multi-layered wiring structure 190 disposed in the first region I. The bit line 195 may extend in a direction intersecting with an extending direction of the plurality of word lines 123 and may be electrically connected to the plurality of variable resistance structures 160 via the plurality of contact plugs 193. The bit line 195 may be connected to second source/drain regions 133 via the contact plugs 193, the variable resistance structures 160, and the buried contact plugs BCP.

According to some example embodiments, the multi-layered wiring structure 191 including the bit line 195 may include at least one of metal, conductive metal nitride, a metal-semiconductor compound, and doped semiconductor. For example, the multi-layered wiring structure 191 including the bit line 195 may include a barrier layer formed of Ta, Ti, TaN, TiN, or a combination thereof, and a metal layer, for example, a W, Al, or Cu layer, formed on the barrier layer.

The plurality of variable resistance structures 160 between the bit line 195 and the buried contact plugs BCP may store data according to their resistance states.

In the second region II, a contact pad 199 is connected to an uppermost line included in the multi-layered wiring structure 191. Although the single contact pad 199 is illustrated in FIG. 9, the inventive concepts are not limited thereto. For example, the second memory device ME2 formed in the second region II may include a plurality of contact pads 199. The plurality of contact pads 199 may at least partially comprise Al, but the inventive concepts are not limited thereto.

The plurality of variable resistance structures 160 disposed in the second region II may be formed on the same level as (e.g., may be coplanar with) the conductive line MLA1 disposed on the wiring layer level closest to the substrate 12 from among the plurality of conductive lines MLA1, MLA2, and MLA3 at different levels that include the multi-layered wiring structure 190 disposed in the first region I.

The plurality of capacitors 150 formed in the first region I may be disposed at locations spaced apart from the upper surface of the substrate 12 by a first vertical distance VD1.

The plurality of variable resistance structures 160 formed in the second region II may be disposed at locations spaced apart from the upper surface of the substrate 12 by a second vertical distance VD2 that is greater than the first vertical distance VD1. The term "vertical distance" used herein denotes a shortest distance in a direction perpendicular to a main surface of a substrate (e.g., a Z direction in FIG. 9).

The plurality of capacitors 150 formed in the first region I may have uppermost surfaces spaced apart from the upper surface of the substrate 12 by a third vertical distance VD3. The uppermost surfaces of the capacitors 150 may be an uppermost surface of the upper electrode 154. In the second region II, a second vertical distance VD2 between the substrate 12 and the plurality of variable resistance structures 160 may be greater than the third vertical distance VD3.

In the IC device 100 of FIG. 9, the plurality of variable resistance structures 160 disposed in the second region II are disposed on the same level as (e.g., are coplanar with) the conductive line MLA1 disposed on the wiring layer level closest to the substrate 12 from among the plurality of conductive lines MLA1, MLA2, and MLA3 of the multi-layered wiring structure 190 disposed in the first region I. However, the inventive concepts are not limited thereto, and the plurality of variable resistance structures 160 may be disposed on various levels on the substrate 12 in the second region II. As referred to herein, elements that are coplanar with each other may have individual surfaces that are coplanar with each other and separate surfaces that are not coplanar with each other. For example, as shown in FIG. 9, where the variable resistance structures 160 are coplanar with the conductive line MLA1, the bottom surfaces 160a of the variable resistance structures 160 are coplanar with the bottom surfaces 902a of the conductive line MLA1 and the upper surfaces 160b of the variable resistance structures 160 are not coplanar with the upper surfaces 902b of the conductive line MLA1.

In some example embodiments, at least one layer of multi-layered wiring structure 190 may be coplanar with at least one layer of multi-layered wiring structure 191. For example, as shown in at least FIG. 9, conductive line MLA2 of multi-layered wiring structure 190 is coplanar with bit line 195 of multi-layered wiring structure 191, and conductive line MLA3 of multi-layered wiring structure 190 is coplanar with conductive line MLB of multi-layered wiring structure 191. In some example embodiments, such coplanar layers may be formed concurrently as part of a common operation.

Figure 11:
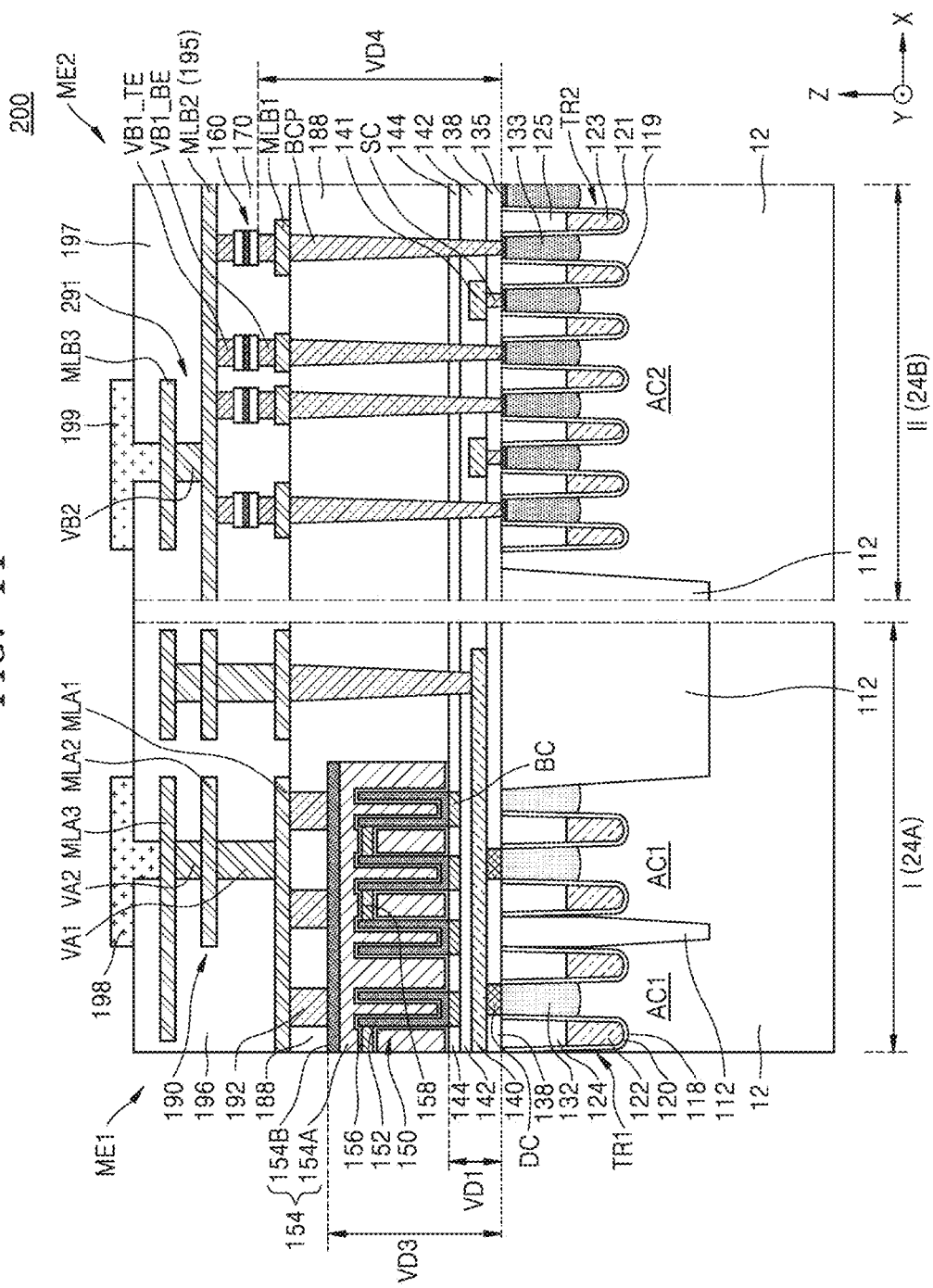
FIG. 11 is a cross-sectional view for explaining an IC device according to some example embodiments of the inventive concepts.

FIG. 11 is a cross-sectional view for explaining an IC device 200 according to some example embodiments of the inventive concepts. The same reference numerals in FIG. 11 as those in FIG. 9 denote the same elements, and thus detailed descriptions thereof will be omitted.

The IC device 200 of FIG. 11 has mostly the same structure as that of the IC device 100 of FIG. 9. However, a multi-layered wiring structure 291 in the second region II includes a plurality of conductive lines MLB1, MLB2, and MLB3 extending in parallel to a main surface extending direction of the substrate 12 at different levels, and a plurality of via contacts VB1_BE, VB1_TE, and VB2 for connecting the plurality of conductive lines MLB1, MLB2, and MLB3 at different levels to each other. The conductive line MLB2 formed on a wiring layer level second-closest to the substrate 12 among the plurality of conductive lines MLB1, MLB2, and MLB3 may function as the bit line 195.

In the second region II, the plurality of variable resistance structures 160 may be disposed between the conductive line MLB1 formed on a wiring layer level closest to the substrate 12 from among the plurality of conductive lines MLB1, MLB2, and MLB3 and the conductive line MLB2 formed on the wiring layer level second-closest to the substrate 12 from among the plurality of conductive lines MLB1, MLB2, and MLB3. The via contact VB1_BE is connected between the conductive line MLB1 formed on the wiring layer level closest to the substrate 12 and the plurality of variable resistance structures 160, and the via contact VB1_TE is connected between the plurality of variable resistance structure 160 and the conductive line MLB2 formed on the wiring layer level second-closest to the substrate 12. According to some example embodiments, the via contact VB1_BE may function as lower electrodes of the variable resistance structures 160, and the via contact VB1_TE may function as upper electrodes of the variable resistance structures 160.

The conductive line MLA1 of the multi-layered wiring structure 190 disposed in the first region I, which is disposed on the wiring layer level closest to the substrate 12, may be formed on the same level as the conductive line MLB1 of the multi-layered wiring structure 190 disposed in the second region II, which is disposed on the wiring layer level closest to the substrate 12. The conductive line MLA2 of the multi-layered wiring structure 190 disposed in the first region I, which is disposed on the wiring layer level second-closest to the substrate 12, may be formed on the same level as (e.g., may be coplanar with) the conductive line MLB2 of the multi-layered wiring structure 190 disposed in the second region II, which is disposed on the wiring layer level second-closest to the substrate 12. The conductive line MLA3 of the multi-layered wiring structure 190 disposed in the first region I, which is disposed on the wiring layer level third-closest to the substrate 12, may be formed on the same level as the conductive line MLB3 of the multi-layered wiring structure 190 disposed in the second region II, which is disposed on the wiring layer level third-closest to the substrate 12. Descriptions of the materials used to form the multi-layered wiring structure 291 are substantially the same as those of the multi-layered wiring structure 191 described with reference to FIG. 9.

The plurality of variable resistance structures 160 formed in the second region II may be disposed at locations spaced apart from the substrate 12 by a fourth vertical distance VD4 that is greater than the first vertical distance VD1 and the third vertical distance VD3.

Figure 12:
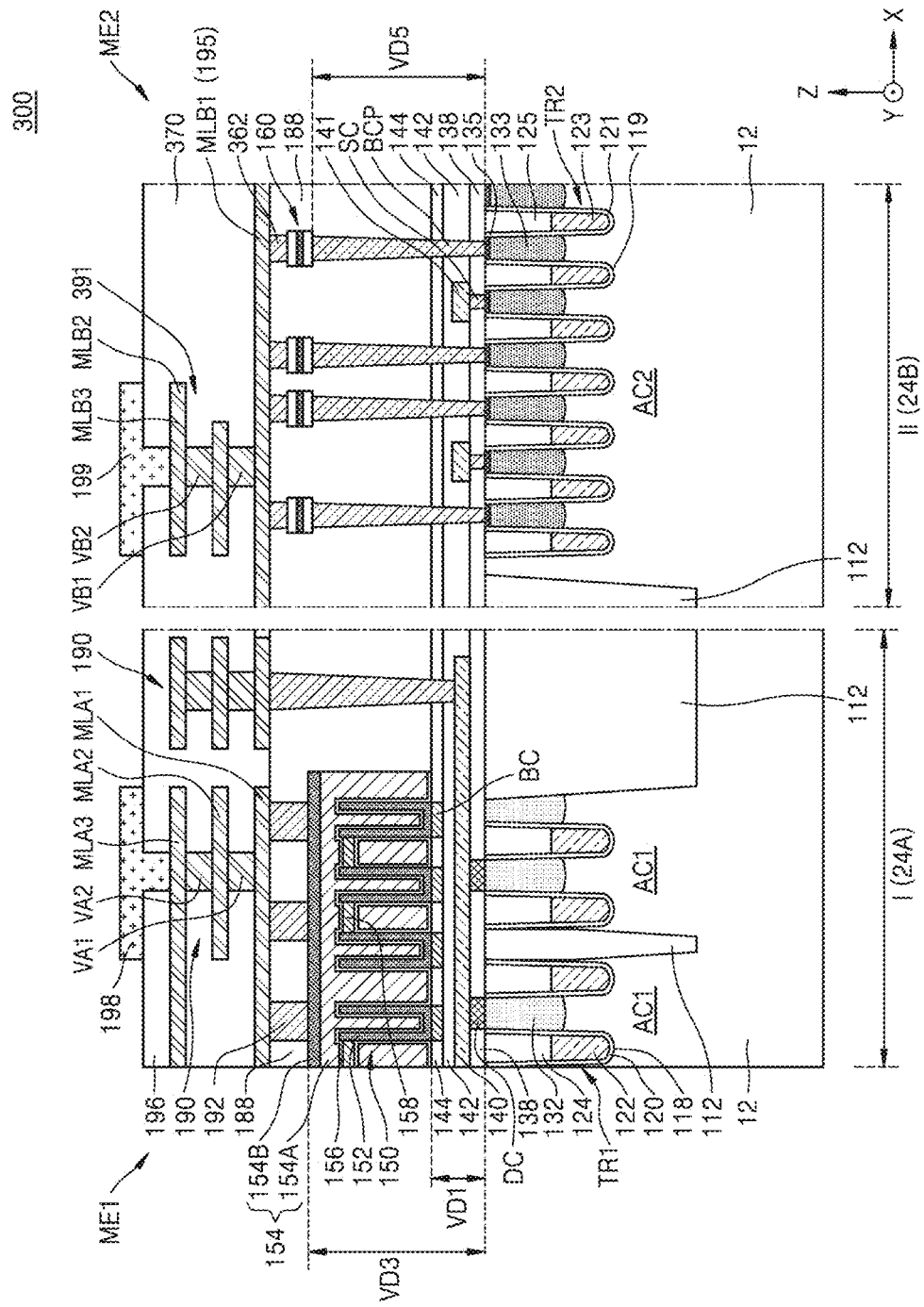
FIG. 12 is a cross-sectional view for explaining an IC device according to some example embodiments of the inventive concepts.

FIG. 12 is a cross-sectional view for explaining an IC device 300 according to some example embodiments of the inventive concepts. The same reference characters and numerals in FIG. 12 as those in FIGS. 9-11 denote the same elements, and thus their description will be omitted herein.

The IC device 300 of FIG. 12 has mostly the same structure as that of the IC device 100 of FIG. 9. However, a multi-layered wiring structure 391 in the second region II includes a plurality of conductive lines MLB1, MLB2, and MLB3 extending in parallel to a main surface extending direction of the substrate 12 at different levels, and a plurality of via contacts VB1 and VB2 for connecting the plurality of conductive lines MLB1, MLB2, and MLB3 at different levels to each other. The conductive line MLB1 disposed on a wiring layer level closest to the substrate 12 among the plurality of conductive lines MLB1, MLB2, and MLB3 may function as the bit line 195. The multi-layered wiring structure 391 may be covered with an interlayer insulation layer 370.

The conductive line MLA1 of the multi-layered wiring structure 190 disposed in the first region I, which is disposed on the wiring layer level closest to the substrate 12, and the conductive line MLB1 of the multi-layered wiring structure 391 disposed in the second region II, namely, the bit line 195, which is disposed on the wiring layer level closest to the substrate 12, may be formed on the same level. Descriptions of the materials used to form the multi-layered wiring structure 391 are substantially the same as those of the multi-layered wiring structure 191 described with reference to FIG. 9.

In the second region II, the plurality of variable resistance structures 160 may be disposed between the plurality of buried contact plugs BCP and the multi-layered wiring structure 391. The bit line 195 may be electrically connected to the plurality of variable resistance structures 160 via a plurality of contact plugs 362. The plurality of variable resistance structures 160 may be disposed on a level lower than the conductive line MLA1 of the multi-layered wiring structure 190 disposed in the first region I, which is disposed on the wiring layer level closest to the substrate 12, namely, on a level of a vertical distance closest to the substrate 12.

The plurality of capacitors 150 formed in the first region I may have uppermost surfaces spaced apart from the upper surface of the substrate 12 by the third vertical distance VD3, and the plurality of variable resistance structures 160 formed in the second region II may be disposed at locations spaced apart from the substrate 12 by a fifth vertical distance VD5 which is equal to or greater than the third vertical distance VD3. However, embodiments of the inventive concepts are not limited to the example of FIG. 12. According to some example embodiments, the variable resistance structures 160 may be disposed at locations spaced from the substrate 12 by a vertical distance that is less than the third vertical distance VD3. For example, the variable resistance structures 160 may be disposed at a level that is higher than the level of the bit line 140 in the first region I and is lower than the level of the uppermost surfaces of the capacitors 150.

Figure 13:
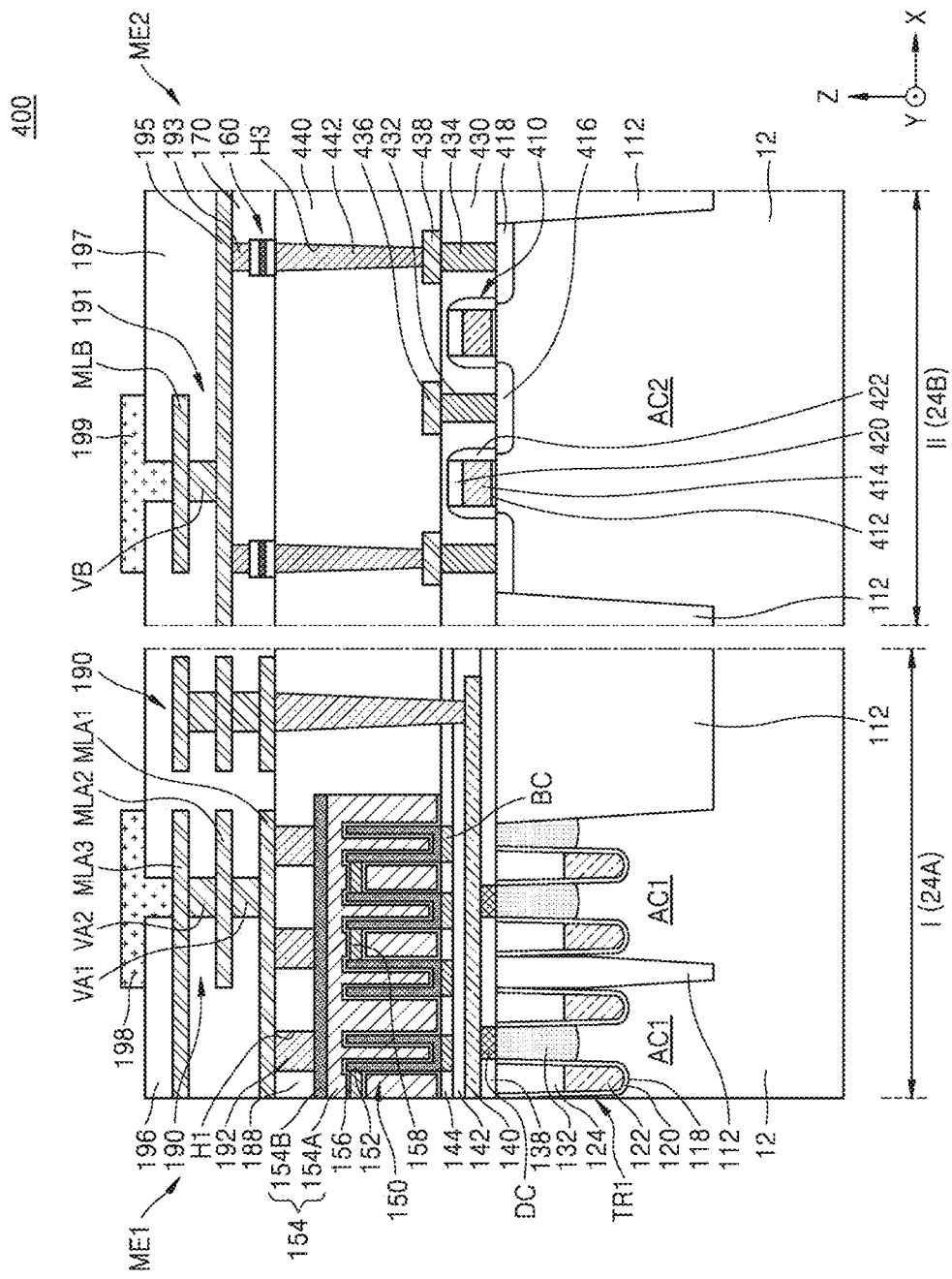
FIG. 13 is a cross-sectional view for explaining an IC device according to some example embodiments of the inventive concepts.

FIG. 13 is a cross-sectional view for explaining an IC device 400 according to some example embodiments of the inventive concepts. The same reference characters and numerals in FIG. 13 as those in FIGS. 9-12 denote the same elements, and thus their description will be omitted herein.

The IC device 400 of FIG. 13 has mostly the same structure as that of the IC device 100 of FIG. 9. However, in contrast with the IC device 100 of FIG. 9 including the plurality of second transistors TR2 buried in the substrate 12, a second memory device ME2 formed in the second region II includes a plurality of planar transistors 410 formed on the substrate 12.

In more detail, the planar transistors 410 included in the second memory device ME2 include a gate insulation layer 412, a second word line 414, a source region 416, and a drain region 418. The second word line 414 may be covered with an insulation capping layer 420 and insulation spacers 422.

According to some example embodiments, the second word line 414 of the plurality of planar transistors 410 formed in the second region II may include a conductive material that is the same as a conductive material included in the bit line 140 formed in the first region I.

The source region 416 and the drain region 418 may be impurity-doped regions.

According to some example embodiments, an impurity-doping concentration in the source and drain regions 416 and 418 may be equal to that in the plurality of first source/drain regions 132 formed in the first region I. According to some example embodiments, the impurity-doping concentration in the source and drain regions 416 and 418 may be greater than that in the plurality of first source/drain regions 132 formed in the first region I.

The plurality of planar transistors 410 may be covered with a first interlayer insulation layer 430 that is planarized. A first contact plug 432 electrically connected to the source region 416 and a second contact plug 434 electrically connected to the drain region 418 may be formed to penetrate through the first interlayer insulation layer 430. A source line 436 and a conductive pattern 438 may be formed on the first interlayer insulation layer 430. The source line 436 may be electrically connected to the source region 416 via the first contact plug 432, and the conductive pattern 438 may be electrically connected to the drain region 418 via the second contact plug 434. The source line 436 and the conductive pattern 438 may be covered with a second interlayer insulation layer 440. A lower electrode contact plug 442 may penetrate through the second interlayer insulation layer 440 and may be connected to the conductive pattern 438. The lower electrode contact plug 442 may include at least one material selected from among TiN, Ti, TaN, Ta, and W.

The plurality of variable resistance structures 160 may be formed on the second interlayer insulation layer 440 and the lower electrode contact plug 442. The plurality of variable resistance structures 160 are illustrated as being disposed on the same level as the conductive line MLA1 disposed on the wiring layer level closest to the substrate 12 from among the plurality of conductive lines MLA1, MLA2, and MLA3 of the multi-layered wiring structure 190 disposed in the first region I. For example, the IC device 400 may include the multi-layered wiring structure 291 of FIG. 11 instead of the multi-layered wiring structure 191 of FIG. 13, and the plurality of variable resistance structures 160 in the second region II may be disposed between the conductive line MLB1 formed on the wiring layer level closest to the substrate 12 from among the plurality of conductive lines MLB1, MLB2, and MLB3 and the conductive line MLB2 formed on the wiring layer level second-closest to the substrate 12 from among the plurality of conductive lines MLB1, MLB2, and MLB3. As another example, the IC device 400 may include the multi-layered wiring structure 391 of FIG. 12 instead of the multi-layered wiring structure 191 of FIG. 13, and the plurality of variable resistance structures 160 may be disposed between the conductive pattern 438 and the multi-layered wiring structure 391.

IC devices according to some example embodiments of the inventive concepts include a plurality of memory devices that are formed on a plurality of separated regions on a single substrate that includes a single chip and have different types of unit memory cell structures having different structures. In particular, the IC devices 100, 200, 300, and 400 of FIGS. 9, 11, 12, and 13 implement a memory system including respective advantages of a DRAM, which is a volatile memory device, and an MRAM, which is a nonvolatile memory device, on a single substrate, thereby providing a system configured to efficiently transmitting a large amount of data between a volatile memory and a nonvolatile memory by using a single chip. According to some example embodiments of the inventive concepts, there is provided an IC device having a structure configured to implement, without using packaging technology, devices having various functions that satisfy demands for convergence, intellectualization, and networking of intelligent technology (IT) and miniaturization of apparatuses. As a result, such an IC device may enable a reduction in costs associated with providing a device configured to implement such functions, including manufacturing costs, space/volume costs, resource costs, some combination thereof, and the like, relative to devices having a structure configured to implement some or all of the above functions based on the use of packaging technology.

Figure 14A:
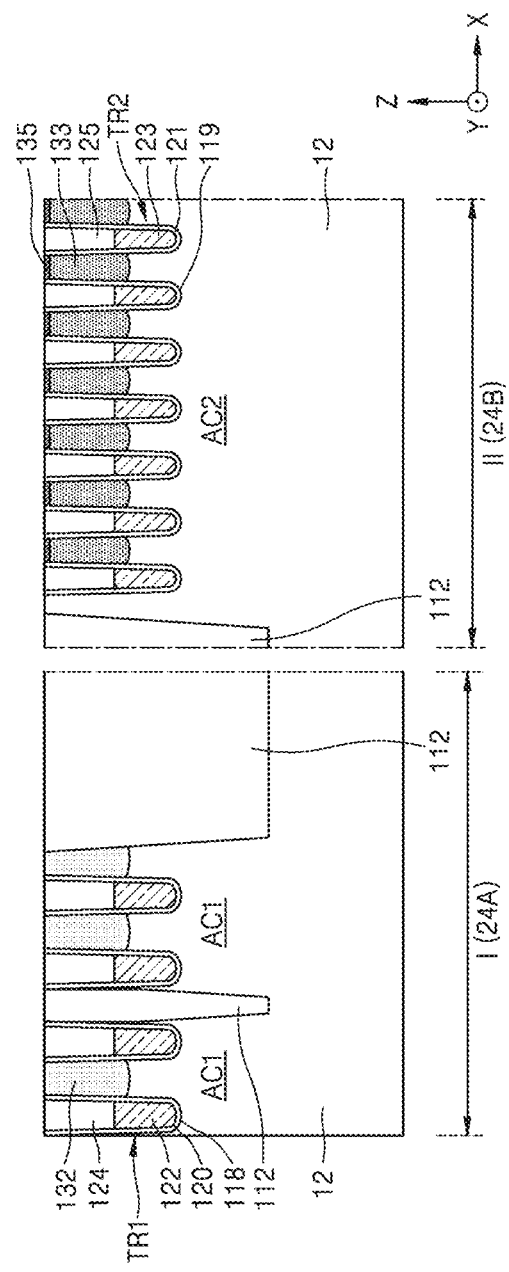
FIG. 14A, FIG. 14B, and FIG. 14C are cross-sectional views for explaining a method of manufacturing an IC device according to some example embodiments of the inventive concepts.
Figure 14B:
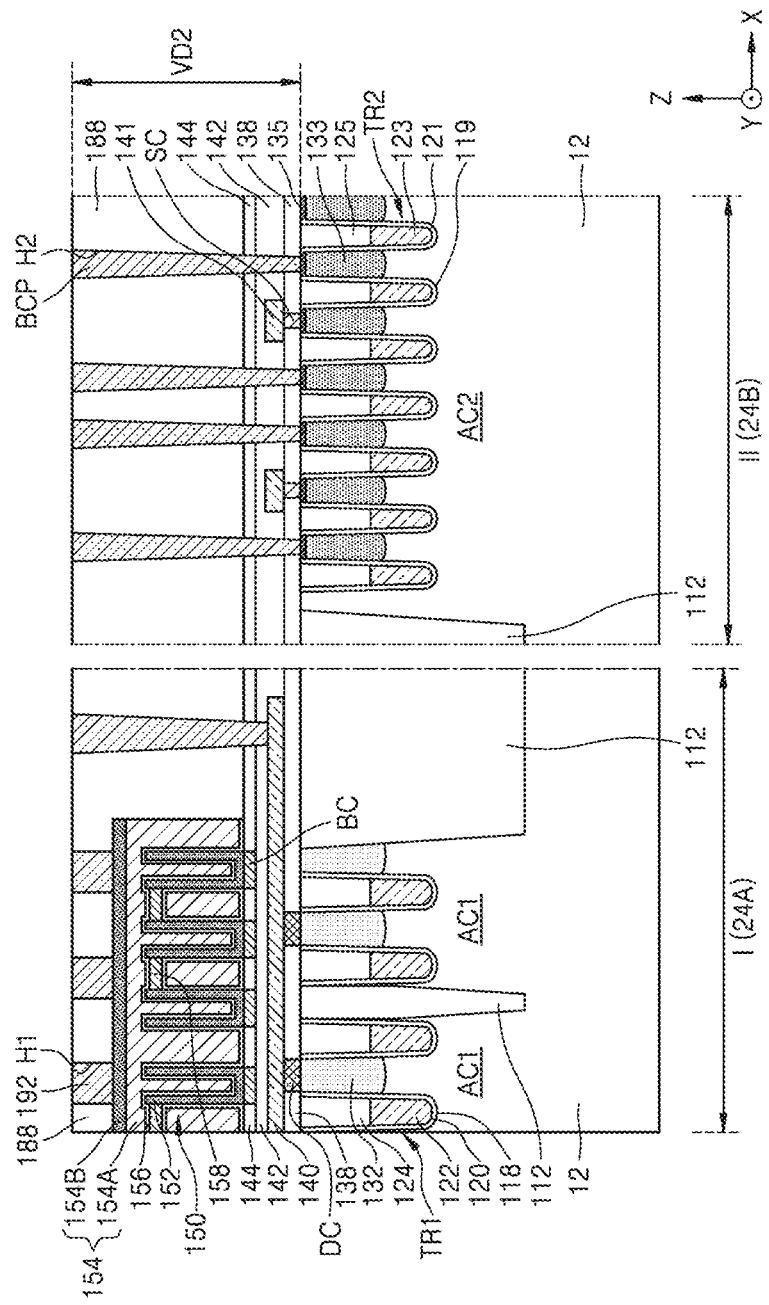
Figure 14C:
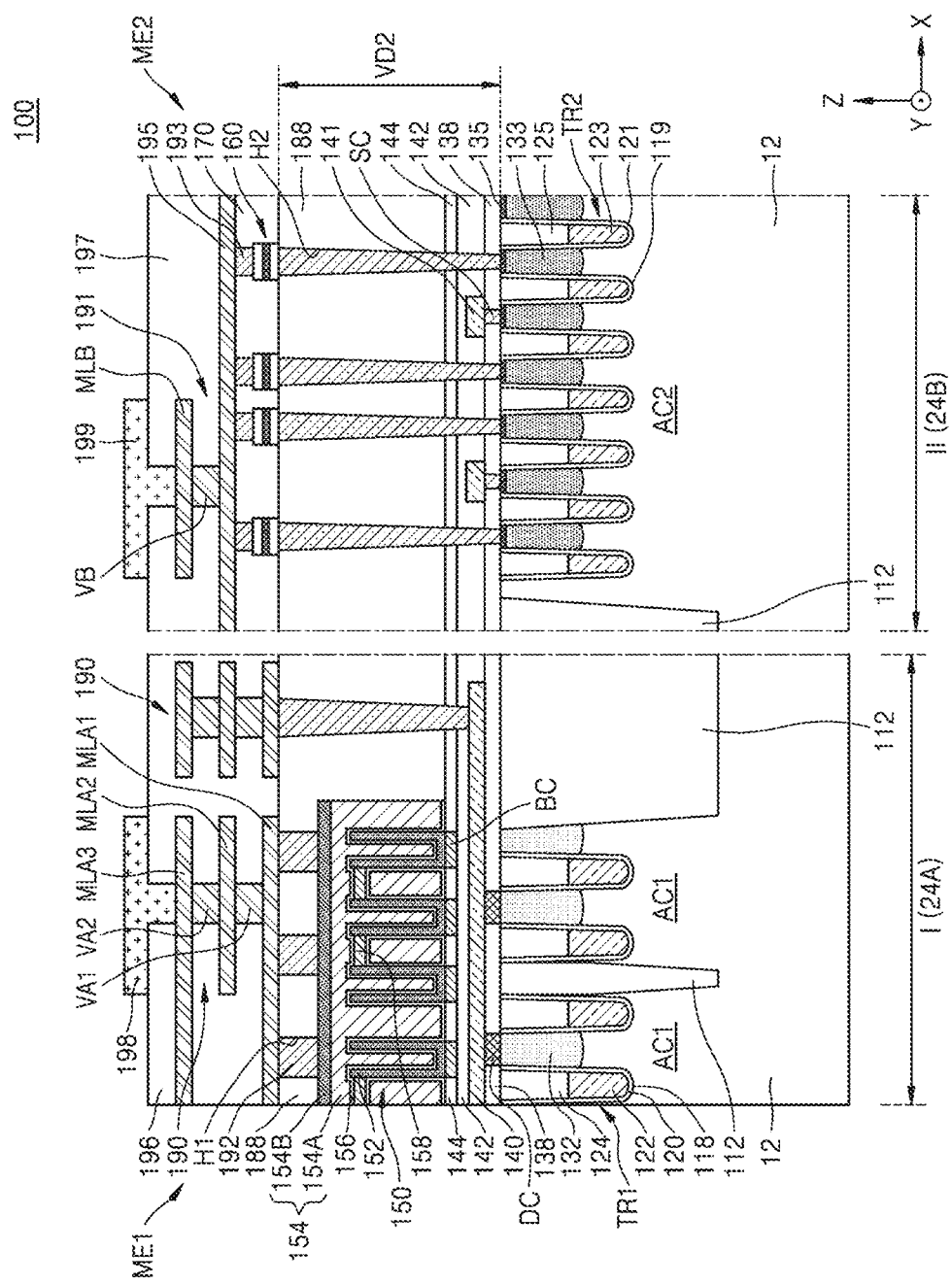

FIGS. 14A-14C are cross-sectional views for explaining a method of manufacturing an IC device according to some example embodiments of the inventive concepts. A method of manufacturing the IC device 100 of FIG. 9 will now be described with reference to FIGS. 14A-14C. The same reference characters and numerals in FIGS. 14A-14C as those in FIG. 9 denote the same elements, and thus their description will be omitted herein.

Referring to FIG. 14A, the isolation layer 112 is formed in the first region I and the second region II of the substrate 12 to thereby define a plurality of first active regions AC1 in the first region I and define a plurality of second active regions AC2 in the second region II. The isolation layer 112 may at least partially comprise an oxide layer, a nitride layer, or a combination thereof.

The plurality of first word line trenches 118 are formed in the first region I of the substrate 12, and the plurality of second word line trenches 119 are formed in the second region II of the substrate 12. The plurality of first and second word line trenches 118 and 119 may be simultaneously formed in the first and second regions I and II. The plurality of first and second word line trenches 118 and 119 may extend in parallel to each other in a Y direction of FIG. 14A. Widths of the plurality of first word line trenches 118 in an X direction may be equal to or different from those of the plurality of second word line trenches 119 in the X direction.

In the first region I, a first gate dielectric layer 120, a first word line 122, and a first buried insulation layer 124 are sequentially formed in each of the plurality of first word line trenches 118. In the second region II, a second gate dielectric layer 121, a second word line 123, and a second buried insulation layer 125 are sequentially formed in each of the plurality of second word line trenches 119. Upper surfaces of the plurality of first buried insulation layers 124 and the plurality of second buried insulation layers 125 may be on approximately the same level as the upper surface of the substrate 12.

In the first region I and the second region II, impurity ions are implanted into the substrate 12 to form the first source/drain regions 132 in upper portions of the first active regions AC1 and form the second source/drain regions 133 in upper portions of the second active regions AC2. According to some example embodiments, the first source/drain regions 132 and the second source/drain regions 133 may be formed simultaneously. In this case, the impurity-doping concentrations in the first source/drain regions 132 and the second source/drain regions 133 may be approximately the same as each other or similar to each other. According to some example embodiments, the first source/drain regions 132 and the second source/drain regions 133 may be sequentially formed using separate ion implantation processes. In this case, the impurity-doping concentrations in the first source/drain regions 132 and the second source/drain regions 133 may be different from each other. For example, the impurity-doping concentration in the plurality of second source/drain regions 133 may be greater than that in the plurality of first source/drain regions 132. According to some example embodiments, an ion implantation process for forming the first source/drain regions 132 and the second source/drain regions 133 may be performed before the first word lines 122 and the second word lines 123 are formed.

In the second region II, the metal silicide layers 135 are formed on respective exposed surfaces of the plurality of second source/drain regions 133. The metal silicide layers 135 may at least partially comprise cobalt silicide or titanium silicide, but embodiments are not limited thereto.

Referring to FIG. 14B, after the buffer insulation layer 138 is formed on the substrate 12 in the first and second regions I and II, the plurality of direct contacts DC penetrating through the buffer insulation layer 138, and the bit line 140 are formed. While the direct contacts DC and the bit line 140 are being formed in the first region I, the plurality of source line contact plugs SC and the plurality of source lines 141 may be formed in the second region II.

After the first insulation layer 142 covering the bit line 140 in the first region I and the plurality of source lines 141 in the second region II is formed, the plurality of buried contacts BC are formed on the first insulation layer 142 in the first region I. The plurality of buried contacts BC may extend from both sides of the Y direction with respect to the bit line 140 in the Z direction and may be connected to the first active regions AC1 of the substrate 12. According to some example embodiments, the plurality of buried contacts BC may have a structure including a contact plug in contact with a first active region AC1 of the substrate 12 and a landing pad formed on the contact plug. The plurality of buried contacts BC may be formed to be insulated from one another by the second insulation layer 144.

In the first region I, the plurality of lower electrodes 152 are formed on the plurality of buried contacts BC. The plurality of lower electrodes 152 may be formed to be supported by the insulation support 158. Thereafter, the dielectric layers 156 are formed on the surfaces of the plurality of lower electrodes 152 and the insulation support 158, and the upper electrodes 154 are formed on the dielectric layers 156.

In the first and second regions I and II, the third insulation layer 188 having a planarized upper surface is formed. The third insulation layer 188 may have a thickness that is sufficient to cover the plurality of capacitors 150.

In the first region I and the second region II, the third insulation layer 188 is partially etched to form a plurality of first contact holes H1 exposing the upper electrodes 154 in the first region I and to form a plurality of second contact holes H2 exposing the metal silicide layers in the second region II. According to some example embodiments, the first and second contact holes H1 and H2 may be formed simultaneously. A difference between a depth of each of the plurality of first contact holes H1 and a depth of each of the plurality of second contact holes H2 may be relatively big, for example, about several μm. The plurality of first contact holes H1 and the plurality of second contact holes H2 having this big depth difference may be formed using an etch selectivity difference between the third insulation layer 188 and the upper electrodes 154. According to some example embodiments, to secure a sufficient etch selectivity between the third insulation layer 188 and the upper electrodes 154, the second conductive layers 154B of the upper electrodes 154 may be formed as SiGe layers and the third insulation layer 188 may be formed as an oxide layer.

The plurality of contact plugs 192 are formed in the plurality of first contact holes H1, and the plurality of buried contact plugs BCP are formed in the plurality of second contact holes H2. The plurality of contact plugs 192 and the plurality of buried contact plugs BCP may be formed simultaneously in the first region I and in the second region II, respectively. The plurality of contact plugs 192 and the plurality of buried contact plugs BCP may at least partially comprise metal, conductive metal nitride, or a combination thereof. According to some example embodiments, the plurality of contact plugs 192 and the plurality of buried contact plugs BCP may include a double layer structure of TiN/W.

Referring to FIG. 14C, a Back End of Line (BEOL) process is performed on a resultant structure in which the plurality of contact plugs 192 and the plurality of buried contact plugs BCP are formed, thereby forming the multi-layered wiring structure 190, the fourth insulation layer 196, and the contact pad 198 in the first region I and forming the plurality of variable resistance structures 160, the fifth insulation layer 170, the multi-layered wiring structure 191, the sixth insulation layer 197, and the contact pad 199 in the second region II.

The plurality of variable resistance structures 160 disposed in the second region II may be formed after the conductive line MLA1 disposed on the wiring layer level closest to the substrate 12 from among the plurality of conductive lines MLA1, MLA2, and MLA3 of the multi-layered wiring structure 190 disposed in the first region I and before the conductive line MLA2 disposed on the wiring layer level second-closest to the substrate 12 from among the plurality of conductive lines MLA1, MLA2, and MLA3 is formed. The conductive line MLA2 and the bit line 195 may be simultaneously formed in the first and second regions I and II, respectively.

Although the method of manufacturing the IC device 100 of FIG. 9 is illustrated and described above with reference to FIGS. 14A-14C, IC devices according to some example embodiments of the inventive concepts may be manufactured using the method of FIGS. 14A-14C and various modifications made thereto within the scope of the inventive concepts.

For example, the IC device 200 of FIG. 11 may be manufactured according to similar processes to the processes described above with reference to FIGS. 14A-14C. However, after the plurality of contact plugs 192 and the plurality of buried contact plugs BCP are formed in the first region I and the second region II of the substrate 12 according to the method described above with reference to FIGS. 14A and 14B, a BEOL process may be performed. When the BEOL process is performed, the multi-layered wiring structure 190, the fourth insulation layer 196, and the contact pad 198 are formed in the first region I of the substrate 12 as described above with reference to FIG. 14C. However, in the second region II of the substrate 12, the plurality of variable resistance structures 160 may be formed to be included in the multi-layered wiring structure 291, in contrast with the process described above with reference to FIG. 14C. To this end, a plurality of structures may be formed, in which, after the conductive line MLA1 disposed on the wiring layer level closest to the substrate 12 from among the plurality of conductive lines MLA1, MLA2, and MLA3 disposed in the first region I and the conductive line MLB1 disposed on the wiring layer level closest to the substrate 12 from among the plurality of conductive lines MLB1, MLB2, and MLB3 disposed in the second region II are formed simultaneously, the via contact VB1_BE, the variable resistance structure 160, and the via contact VB1_TE are sequentially formed on the conductive line MLB1 of the second region II. While the plurality of via contacts VB1_TE are being formed in the second region II of the substrate 12, the via contact VA1 may be formed in the first region I. Thereafter, the conductive line MLA2 of the multi-layered wiring structure 190 disposed on the wiring layer level second-closest to the substrate 12 in the first region I of the substrate 12, and the bit line 195, which is the conductive line MLB2 disposed on the wiring layer level second-closest to the substrate 12 from among the plurality of conductive lines MLB1, MLB2, and MLB3 in the second region II, may be formed simultaneously.

Thereafter, the IC device 200 of FIG. 11 may be manufactured according to the processes described above with reference to FIG. 14C.

According to some example embodiments for manufacturing the IC device 300 of FIG. 12, similar processes to the processes described above with reference to FIGS. 14A-14C may be performed. However, after the plurality of capacitors 150 are formed in the first region I of the substrate 12 according to the method described above with reference to FIGS. 14A and 14B, the plurality of contact plugs 192 and the plurality of buried contact plugs BCP may be formed. Upper surfaces of the plurality of buried contact plugs BCP displayed in the second region II of the substrate 12 may be on a lower level than the level of upper surfaces of the plurality of contact plugs 192 disposed in the first region I of the substrate 12. Thereafter, the plurality of variable resistance structures 160 and the plurality of contact plugs 362 may be formed in the second region II.

Thereafter, a BEOL process may be performed to form the multi-layered wiring structure 190 connected to the plurality of contact plugs 192 in the first region I of the substrate 12 and to form the multi-layered wiring structure 391 connected to the plurality of variable resistance structures 160 via the plurality of contact plugs 362 in the second region II of the substrate 12.

According to some example embodiments for manufacturing the IC device 300 of FIG. 12, after the plurality of capacitors 150 are formed in the first region I of the substrate 12, the third insulation layer 188 having the planarized upper surface may be formed in the first region I and the second region II of the substrate 12. Thereafter, the plurality of buried contact plugs BCP, the plurality of variable resistance structures 160, and the plurality of contact plugs 362 extending to penetrate through the third insulation layer 188 may be formed in the second region II of the substrate 12, and then the plurality of contact plugs 192 may be formed in the first region I of the substrate 12.

To manufacture the IC device 400 of FIG. 13, similar processes to the processes described above with reference to FIGS. 14A-14C may be performed in the first region I of the substrate 12. However, after the plurality of first transistors TR1 are formed by sequentially forming a first gate dielectric layer 120, a first word line 122, and a first buried insulation layer 124 in each of the plurality of first word line trenches 118 and forming the plurality of first source/drain regions 132 in the first region I of the substrate 12, the plurality of planar transistors 410 may be formed in the second region II of the substrate 12. According to some example embodiments, at least a portion of the bit line 140 in the first region I and at least a portion of the second word line 414 in the second region II may be formed simultaneously.

Thereafter, in the second region II of the substrate 12, the planarized first interlayer insulation layer 430 covering the plurality of planar transistors 410 may be formed on the substrate 12, and the first and second contact plugs 432 and 434 respectively electrically connected to the source region 416 and the drain region 418 by penetrating through the first interlayer insulation layer 430 may be formed. After a conductive layer is formed on the first interlayer insulation layer 430, the conductive layer may be patterned to form the source line 436 and the conductive pattern 438. In the first region I of the substrate 12, the buffer insulation layer 138, the plurality of direct contacts DC penetrating through the buffer insulation layer 138, the bit line 140, the first insulation layer 142, the second insulation layer 144, the plurality of buried contacts BC, and the plurality of capacitors 150 may be formed according to a similar method to the method described above with reference to FIG. 14B.

Thereafter, the third insulation layer 188 covering the plurality of capacitors 150 may be formed in the first region I of the substrate 12, and the second interlayer insulation layer 440 covering the source line 436 and the conductive pattern 438 may be formed on the first interlayer insulation layer 430 in the second region II of the substrate 12. The process of forming the second interlayer insulation layer 440 may be performed simultaneously with the process of forming the third insulation layer 188 in the first region I.

Thereafter, according to a method similar to the method described above with reference to FIG. 14B, the third insulation layer 188 and the second interlayer insulation layer 440 are partially etched in the first region I and the second region II to form the plurality of first contact holes H1 exposing the upper electrodes 154 in the first region I and to form a plurality of third contact holes H3 exposing the conductive patterns 438 in the second region II. According to some example embodiments, the first and third contact holes H1 and H3 may be formed simultaneously. The plurality of contact plugs 192 may be formed in the plurality of first contact holes H1, and the plurality of lower electrode contact plugs 442 may be formed in the plurality of third contact holes H3. Thereafter, the IC device 400 of FIG. 13 may be manufactured according to the processes described above with reference to FIG. 14C.

In methods of manufacturing IC devices according to some example embodiments of the inventive concepts, different kinds of memory devices may be formed in a single chip in order to implement, without using existing packaging technology, devices having various functions that satisfy demands for convergence, intellectualization, and networking of IT and miniaturization of apparatuses.

While the inventive concepts have been particularly shown and described with reference to some example embodiments thereof, it will be understood by those of ordinary skill in the art that various changes in form and details may be made therein without departing from the spirit and scope of the present inventive concepts as defined by the following claims.

What is claimed is:

1. A method of manufacturing an integrated circuit (IC) device, the method comprising:
   forming a plurality of first word lines in a substrate, in a first region of the substrate;
   forming a plurality of second word lines at the substrate in a separate, second region of the substrate;
   forming a plurality of capacitors on the plurality of first word lines in the first region;
   forming a plurality of source lines on the plurality of second word lines in the second region;
   forming an insulation layer covering the plurality of capacitors in the first region and the plurality of source lines in the second region; and
   forming a variable resistance structure at a location spaced apart from an upper surface of the plurality of source lines by a first vertical distance, in the second region.

2. The method of claim 1, wherein the plurality of first word lines and the plurality of second word lines are formed simultaneously.

3. The method of claim 1, further comprising:
   forming a first multi-layered wiring structure on the insulation layer in the first region; and forming a second multi-layered wiring structure on the insulation layer in the second region, wherein at least a portion of the first multi-layered wiring structure and at least a portion of the second multi-layered wiring structure are formed simultaneously.

4. The method of claim 3, wherein the forming the variable resistance structure is performed prior to the forming of the first multi-layered wiring structure and prior to the forming of the second multi-layered wiring structure.

5. A method of manufacturing an integrated circuit (IC) device, the method comprising:

forming a plurality of first word lines in a substrate, in a first region of the substrate;

forming a plurality of second word lines at the substrate in a seperate, second region of the substrate;

forming a plurality of capacitors on the plurality of first word lines in the first region;

forming a plurality of source lines on the plurality of second word lines in the second region;

forming an insulation layer covering, the plurality of capacitors in the first region and the plurality of source lines in the second region;

forming a variable resistance structure at a location spaced apart from an upper surface of the substrate by a first vertical distance, in the second region;

forming a second multi-layered wiring structure on the insulation layer in the first region; and forming a second multi-layered wiring structure on the insulation layer in the second region, wherein at least portion of the first multi-layered wiring structure and at least a portion of the second multi-layered wiring structure are formed simultaneously, and wherein the forming the variable resistance structure is performed concurrently with forming the second multi-layered wiring structure.

* * * * *